United States Patent [19]

Jamison et al.

[11] 4,203,257
[45] May 20, 1980

[54] PRINTED CIRCUIT BOARD HOLE CLEANER

[75] Inventors: John W. Jamison, Mission Viejo; William R. Welty, Fullerton, both of Calif.; Vincent A. Masciello, deceased, late of Rowland Heights, Calif., by Doris E. Masciello, heir

[73] Assignee: Hughes Aircraft Company, Culver City, Calif.

[21] Appl. No.: 960,315

[22] Filed: Nov. 13, 1978

Related U.S. Application Data

[63] Continuation of Ser. No. 801,936, May 31, 1977, abandoned.

[51] Int. Cl.² .............................................. B24B 19/22
[52] U.S. Cl. ........................................ 51/2 R; 51/317
[58] Field of Search .................... 51/2 R, 6, 7, 16, 17, 51/18, 20, 317, 318; 134/82, 83, 166 R, 167 R, 171, 199

[56] References Cited

U.S. PATENT DOCUMENTS

| | | | |
|---|---|---|---|
| 2,419,448 | 4/1947 | Gordon | 51/18 |
| 3,009,468 | 11/1961 | Eberle | 134/166 R X |
| 3,039,234 | 6/1962 | Balman | 51/317 X |
| 3,521,412 | 7/1970 | McCarty | 51/7 X |
| 3,728,821 | 4/1973 | Perry | 51/2 R |
| 3,931,828 | 1/1976 | Lawler | 134/199 X |

Primary Examiner—Gary L. Smith
Attorney, Agent, or Firm—Allen A. Dicke, Jr.; W. H. MacAllister

[57] ABSTRACT

Multilaminate printed circuit boards have at least three conductor layers separated by two insulator layers. After drilling through the boards, cleaning of the drilled hole is accomplished by forcing a slurry of granular abrasive grit in a liquid carrier through the hole. Manifolds direct the slurry through the holes thereby cleaning them.

7 Claims, 5 Drawing Figures

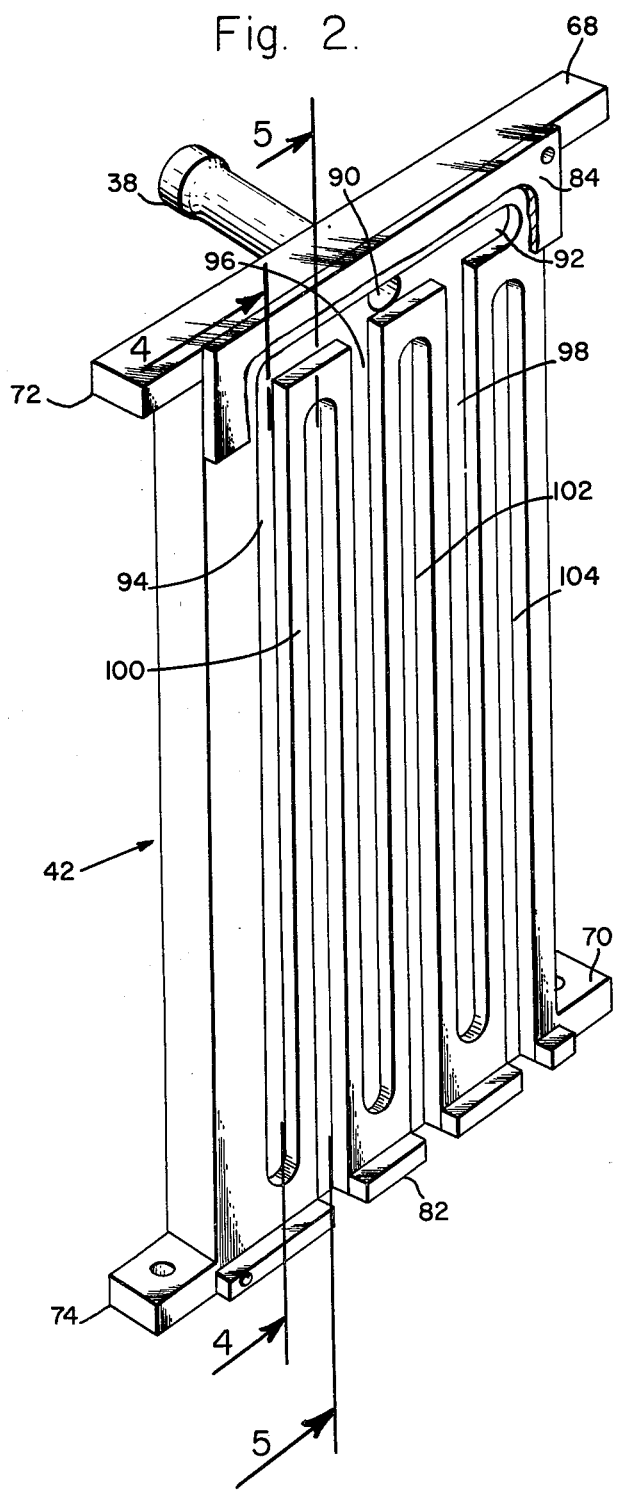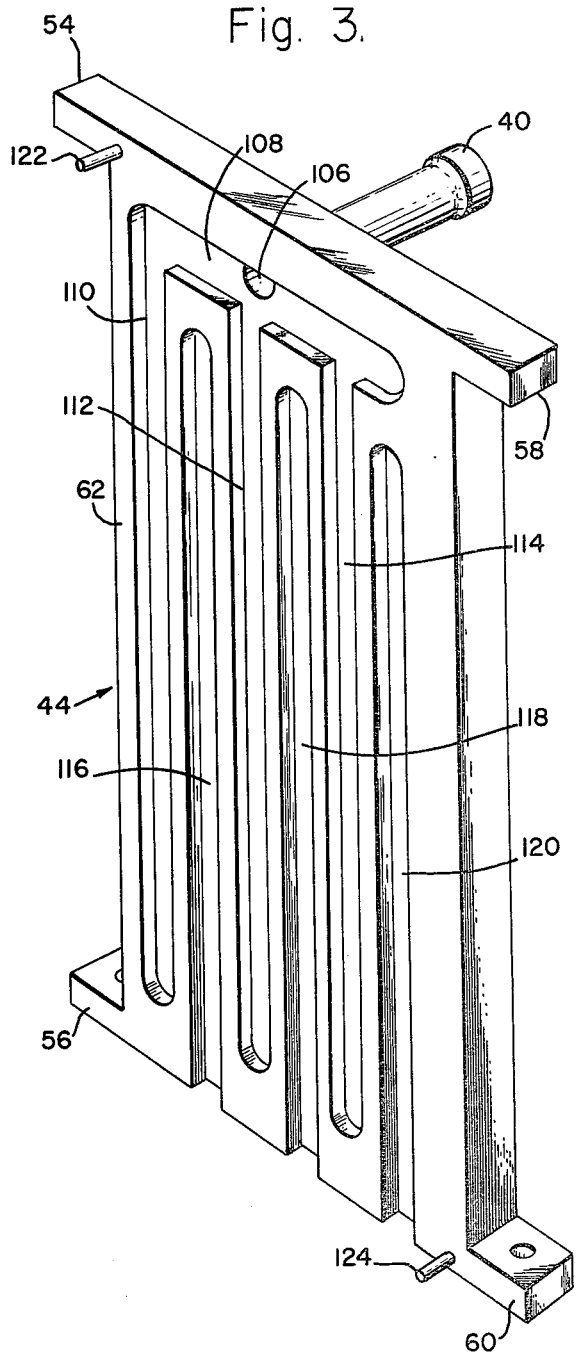

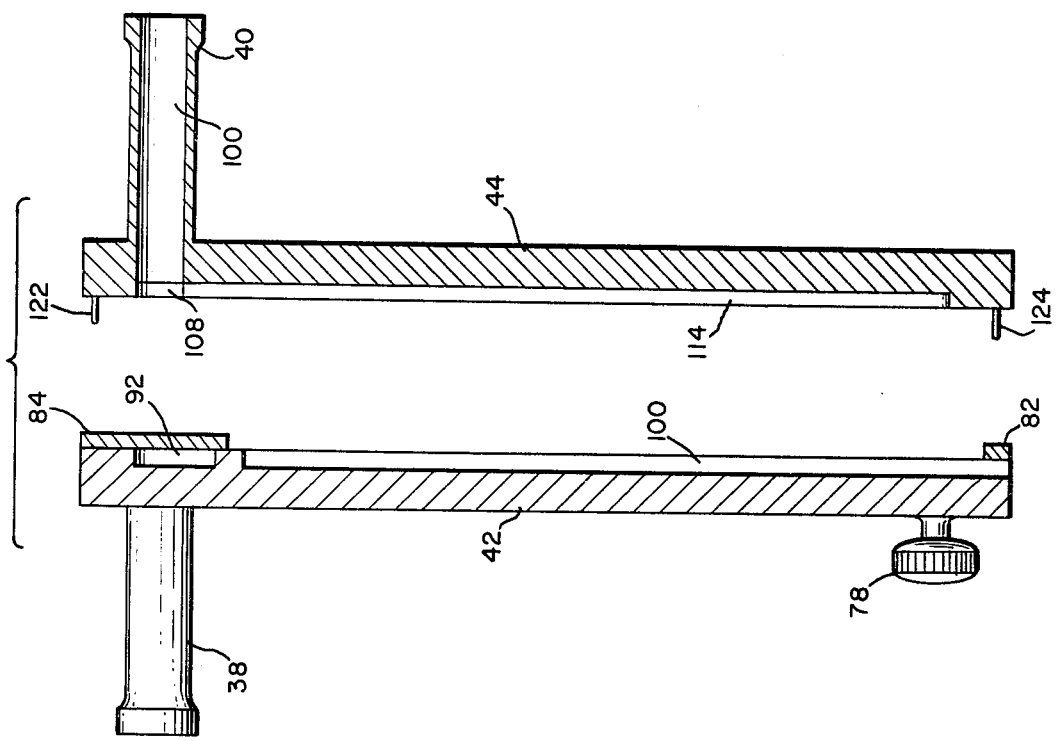
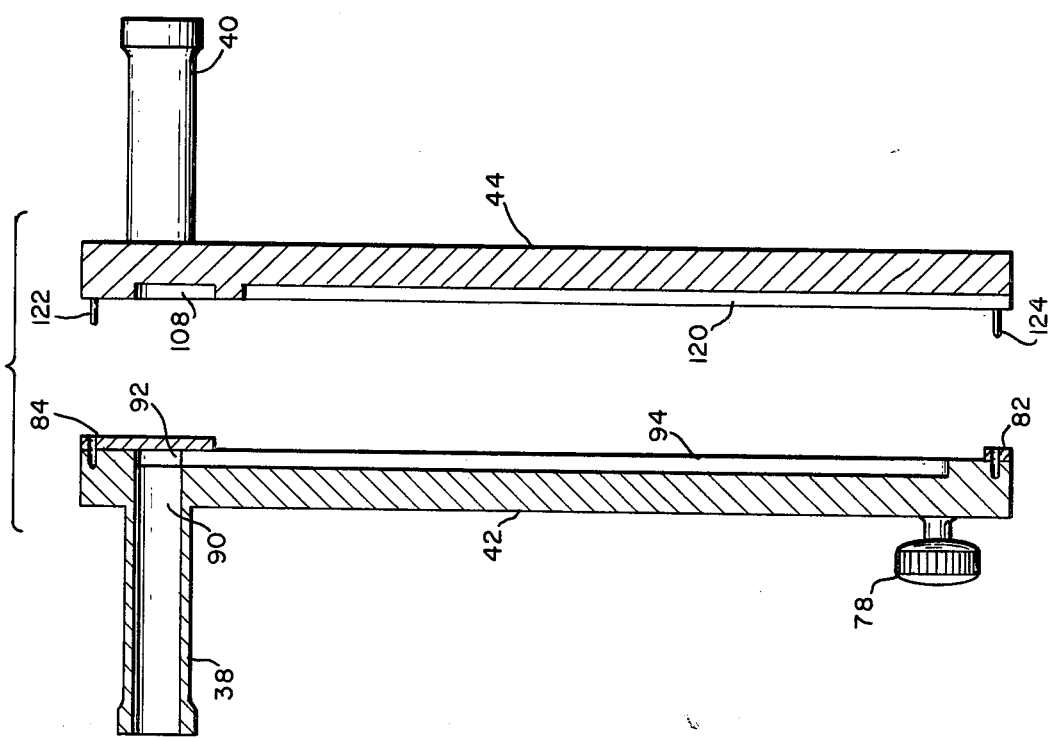

PRINTED CIRCUIT BOARD HOLE CLEANER

This is a continuation of application Serial No. 801,936 filed May 31, 1977, now abandoned

BACKGROUND OF THE INVENTION

This invention is directed to a printed circuit card hole cleaner particularly for multilaminated printed circuit boards. The cleaner forces an abrasive slurry through the holes on the printed circuit board.

In the more complicated classes of printed circuit boards, at least three layers of conductor material, usually copper sheet, are separated by at least two layers of insulator material. The insulator is a glass fiber loaded epoxy material which has considerable mechanical strength. This board material has a surface to which the copper conductor layer can be securely attached. When it is desired to interconnect two or more of the printed circuit conductor layers, a hole is drilled through the board, completely through the conductor layers and the intermediate insulator board stock. It is intended that these holes will be plated through for the purpose of providing electrical continuity.

Residue is deposited on the walls of the holes as a result of the drilling action. The drill in its cutting action generates heat causing epoxy to soften and spread, thereby also displacing glass. The drill can also cause the epoxy and glass to be wiped across the conductor layer laminated within the board. The spread-on material adheres solidly to the conductor. This coating acts as an insulator. If it is not removed, it prevents the making of electrical connection to the interior conductor layer when plating through the hole is attempted. Thus, the interior of the hole must be cleaned so that through-hole plating can make successful and reliable contact with the interior conductor layer.

Prior attempts to clean printed circuit boards include the use of a vapor hone machine. This machine uses a pneumatic blast to carry abrasive grit to the printed circuit board to be cleaned. The pneumatic blast is applied from several inches away from the article to be cleaned. The vapor hone machine successfully cleans the surface and additionally deburrs and rounds the rims of the holes. Such rounding is helpful for successful through plating. However, the vapor hone machine does not adequately clean the internal surfaces of the holes. Thus, when using this machine, reliable through plating cannot be achieved.

The only satisfactory cleaning method previously discovered is the use of the chemical cleaning method. The chemicals to clean away smeared epoxy in the holes must necessarily be strong and thus chemical cleaning of the boards is dangerous. Thus, a reliable, safe inexpensive way of cleaning the through holes is required and has not been available until the advent of the printed circuit board hole cleaner machine of this invention.

SUMMARY OF THE INVENTION

In order to aid in the understanding of this invention, it can be stated in essentially summary form that it is directed to a printed circuit board hole cleaner which employs a liquid slurry carrying an abrasive through a manifold to the printed circuit boards so that the slurry passes through the printed circuit board holes for the cleaning thereof.

It is an object of this invention to provide a machine by which the holes through printed circuit boards can be cleaned. It is a further object to provide cleaning through printed circuit board holes which is satisfactory for reliable through plating in the holes. It is another object to provide a machine whereby an abrasive carried in a liquid slurry is forced through the holes in the printed circuit board to clean the holes. It is a further object to also clean the surfaces and round the edges of the holes of a printed circuit board. It is a further object to provide a manifold structure in a printed circuit board cleaning machine whereby liquid slurry is delivered through the holes in the board in a uniform way for equal cleaning and pressure balance.

Other objects and advantages of this invention will become apparent from a study of the following portion of this specification, the claims and the attached drawings.

BRIEF DESCRIPTION OF THE DRAWINGS

FIG. 2 is an enlarged isometric view of the face of one of the manifolds, as seen along the line 2—2 of FIG. 1.

FIG. 3 is an enlarged isometric view, similar to FIG. 2, showing the face of the other manifold, as seen along the line 3—3 of FIG. 1.

FIG. 4 is a section through both of the manifolds, shown as if they are facing and spaced from each other, as taken along the line 4—4 of FIG. 2.

FIG. 5 is a view similar to FIG. 4, but taken along the line 5—5 of FIG. 2.

DESCRIPTION OF THE PREFERRED EMBODIMENT

Figure 1:
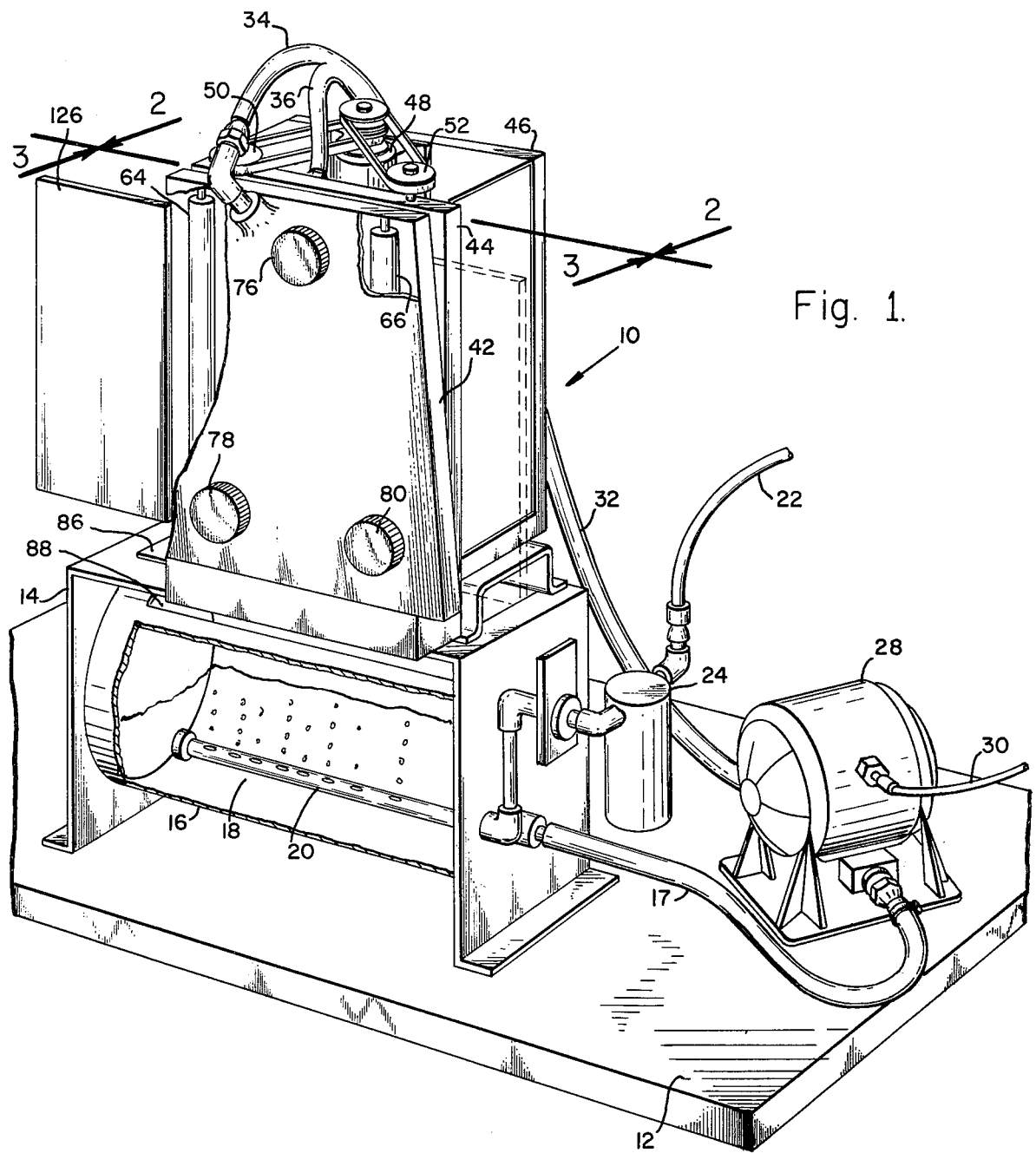
FIG. 1 is a perspective view of the printed circuit board hole cleaner of this invention.

The printed circuit board hole cleaner is indicated generally at 10 and is illustrated in perspective in FIG. 1. In the preferred embodiment, the hole cleaner is a printed circuit board hole cleaner and thus is of sufficiently small size that it may rest on a table, such as table top 12. When the machine is constructed to clean holes in larger boards, it may be of sufficient size to rest on the floor. Support base 14 rests on the table top and serves as the main frame supporting the various parts of the cleaner structure. Tank 16 rests between the legs of support base 14. Slurry 18 is stored in tank 16 which is illustrated as being approximately half full. The slurry is about 50% by volume of abrasive grit in water. Abrasive grits of silicon carbide, garnet and aluminum oxide are useful. Grit size ranges from 80 to 240 mesh. Grit size is a function of hole size, and for the usual printed circuit board 200 mesh, aluminum oxide is the preferred grit. Slurry 18 is mixed by air bubble discharge from bubbler pipe 20. Air is supplied from air hose 22 through filter-regulator-flow controller 24 to be delivered to the air bubbler pipe. Fittings may be attached to tank 16 to fill and drain the tank, and to wash down the tank when cleaning is desired. Slurry suction line 17 is connected adjacent the bottom of tank 16 and is connected to slurry pump 28. Any convenient motive means can be employed to drive slurry pump 28, but in the present case, it is driven by an air motor which is supplied by air line 30. Slurry is delivered under pressure through delivery line 32. As seen at the top of FIG. 1, slurry delivery line 32 is branched into outlet lines 34 and 36.

Outlet lines 34 and 36 are respectively attached to connectors 38 and 40, respectively attached to manifolds 42 and 44. The configuration of the manifolds will be described in detail below. Each of the manifolds receives slurry from the slurry delivery and outlet lines and the used slurry is discharged down out of the bottom of the manifolds.

Manifold 44 is secured on mounting frame 46, see FIG. 1. Motor 48 drives pulleys 50 and 52 which are on the top of roller shafts mounted at the leading and exit edges of manifold 44. Ears 54 and 56, see FIG. 3, are mounted at the leading edge of manifold 44 while ears 58 and 60 are mounted at the trailing edge. The bearing holes through the ears carry a shaft, and a roller is secured on the shaft. The roller has such diameter as to extend about 0.010 inches above face 62 of manifold 44. The rollers are preferably rubber covered for resiliency and traction. Similarly, the rollers 64 and 66 are respectively mounted between ears 68 and 70 at the leading edge of manifold 42 and between ears 72 and 74 at the trailing edge of manifold 42. Rollers 64 and 66 are the same as the earlier described rollers, but are idlers.

Manifold 42 is mounted to face manifold 44 and is detachably secured thereto by quick release fasteners controlled by knobs 76, 78 and 80. Manifold 42 is held spaced the correct distance away from manifold 44 by means of spacer strip 82 on the bottom and spacer baffle 84 at the top. The spacers can be easily changed to regulate the spacing between the manifolds to adjust the cleaning machine for boards of different thickness. Support base 14 has opening 86 at its top, and tank 16 has an opening 88 in its top so that liquid slurry discharged from the manifolds drops straight down into the tank for reuse.

FIGS. 2, 3, 4 and 5 show the manifold construction in more detail. In FIG. 2, spacer baffle 84 is broken away to show inlet 90 which connects with transverse inlet channel 92. Vertical distributing channels 94, 96 and 98 are connected at the top to inlet channel 92 and are closed at the bottom. Positioned adjacent to the distributor channels are outlet channels 100, 102 and 104. The outlet channels are closed at the top and open at the bottom of the manifold.

Manifold 44 has a similar structure with inlet 106 connected to inlet channel 108 which extends cross ways across the top of the manifold. Distributor channels 110, 112 and 114 extend downward through the face of the manifold. They are open at the top to channel 108 and are closed at bottom. Outlet channels 116, 118 and 120 are closed at the top and open at the bottom.

When manifold 42 is placed on manifold 44, it is located in correct orientation by means of locating pins 122 and 124 engaging in corresponding locating holes in manifold 42. When the manifolds are located facing each other, distributor channel 110 faces outlet channel 104, distributor channel 98 faces outlet channel 116, distributor channel 112 faces outlet channel 102, distributor channel 96 faces outlet channel 118, distributor channel 114 faces outlet channel 100, and distributor channel 94 faces outlet channel 120. The areas of the distributor channels are the same in both manifolds, and the areas of the outlet channels are the same in both manifolds so that there is a pressure balance across the board positioned therebetween. When a printed circuit board is placed between the manifolds, the pressure balance holds the board in the center of the space so that as the board is advanced there is no scarring of the board by scraping on the manifold faces.

In use, with bubbler 20 and slurry pump 28 operating, printed circuit board 126 having holes therethrough, see FIG. 1, is inserted in the slot between the manifolds defined by the thickness of spacers 82 and 84. It is engaged between the rollers at the inlet end, roller 64 and its facing driven partner, and the board is thus advanced between the manifolds. As a hole passes a distributor channel, the slurry is forced through the hole to the outlet channel and the opposite manifold. As the board moves between the manifolds, being propelled by the drive rollers, the hole next passes the distributor channel in the opposite manifold so that slurry is forced through the hole in the opposite direction. Pressure balance permits the board to advance without drag. This is repeated so that there are six locations where each hole has slurry driven through it, three times in one direction and three times in the other. In this way, abrasive slurry is forced through the drilled holes in the printed circuit board. One board after another can be propelled between the manifolds for cleaning. The spacing between the faces of the manifold is about 0.010 inches greater than the board thickness and the spacing between the rollers is about 0.020 inches closer than the thickness of the printed circuit board. Adjustment can readily be made by changing the spacers 82 and 84, as other board thicknesses need to be processed. This cleaning method properly and throughly cleans the surfaces and the holes through the boards so that with rinsing, the boards are ready for the subsequent plating process steps.

This invention having been described in its preferred embodiment, is clear that it is susceptible to numerous modifications and embodiments within the ability of those skilled in the art and without the excercise of the inventive faculty. Accordingly, the scope of this invention is defined by the scope of the following claims.

What is claimed is:

1. A machine for cleaning holes through a flat board, said machine comprising:
   a first manifold having liquid slurry distribution channels therein;
   a second manifold having liquid slurry distribution channels therein;
   supply means connected to both said manifolds for supplying an abrasive carrying liquid slurry through said manifolds and to said liquid slurry distribution channels in both of said manifolds for delivery to a board facing said manifold for passage of the slurry through the holes in the board for the cleaning of the holes; and
   outlet channels in each of said manifolds, said outlet channels of said second manifold facing said distribution channels of said first manifold and said outlet channels of said first manifold facing said distribution channels of said second manifold.

2. The machine of claim 1 wherein said slurry distribution channels are of substantially the same area to balance the slurry pressure on a board therebetween.

3. The machine of claim 1 wherein said manifolds have spacing means for holding said manifolds spaced from each other so that a board may pass therebetween, and there is feed means for feeding a board through the space between said manifolds.

4. The machine of claim 3 wherein said spacing means comprises first and second spacers detachably secured to said first manifold so that they can be replaced with spacers of different thickness to achieve selected manifold spacing.

5. The machine of claim 10 wherein the areas of said distribution channels in said manifolds are substantially equal and the areas of said outlet channels are substantially equal in said manifolds for substantially slurry pressure balance on a board between said manifolds.

6. The machine of claim 5 wherein said channels are generally oriented in an upright positon, and inlet channel in each of said manifolds, said distribution channels being connected to said inlet channel, said inlet channel being connected to said abrasive slurry supply means so that abrasive slurry is distributed into said distribution channels and from said distribution channels through holes in the board to outlet channels in the opposite manifold, said outlet channels being open at the bottom.

7. The machine of claim 1 wherein feed means is provided for advancing boards between said manifolds, said feed means comprising at least one feed roller positioned adjacent the space between said manifolds so that a board positioned in the space are engaged by said feed roller to advance the board through said space.

* * * * *